(12) United States Patent
Hobein et al.

(10) Patent No.: US 8,520,381 B2
(45) Date of Patent: Aug. 27, 2013

(54) INVERTER WITH ELECTRICAL AND ELECTRONIC COMPONENTS ARRANGED IN A SEALED HOUSING

(75) Inventors: Thorsten Hobein, Fuldatal (DE); Bernd Gebert, Niestetal (DE); Lars Bethke, Göttingen (DE)

(73) Assignee: SMA Solar Technology AG, Niestetal (DE)

( * ) Notice: Subject to any disclaimer, the term of this patent is extended or adjusted under 35 U.S.C. 154(b) by 273 days.

(21) Appl. No.: 12/885,887

(22) Filed: Sep. 20, 2010

(65) Prior Publication Data

US 2011/0069451 A1 Mar. 24, 2011

Related U.S. Application Data

(60) Provisional application No. 61/245,058, filed on Sep. 23, 2009.

(30) Foreign Application Priority Data

Sep. 18, 2009 (EP) .................................... 09170740

(51) Int. Cl.
 *H05K 7/20* (2006.01)
(52) U.S. Cl.
 USPC ...... 361/679.54; 361/709; 361/752; 361/760; 363/141; 454/184; 429/120
(58) Field of Classification Search
 USPC ................. 361/676–678, 694–695, 703–704, 361/719–721, 679.46–679.47, 679.54, 688–690, 361/707, 709–710, 752, 760, 762, 783–785; 165/185; 174/16.1, 16.3; 363/141; 454/184
 See application file for complete search history.

(56) References Cited

U.S. PATENT DOCUMENTS

| 5,065,278 | A  | * | 11/1991 | Schultz ......................... 361/688 |
| 5,485,350 | A  |   | 1/1996  | Hecht et al. |
| 5,497,289 | A  | * | 3/1996  | Sugishima et al. ........... 361/709 |
| 5,598,328 | A  | * | 1/1997  | Dore ............................. 363/141 |
| 5,930,113 | A  | * | 7/1999  | McCann ....................... 361/704 |
| 5,946,192 | A  | * | 8/1999  | Ishigami et al. .............. 361/704 |
| 5,946,193 | A  | * | 8/1999  | Hendrix et al. ............... 361/704 |
| 5,969,943 | A  | * | 10/1999 | Oyamada ..................... 361/695 |
| 6,038,129 | A  | * | 3/2000  | Falaki et al. .................. 361/699 |
| 6,374,912 | B1 | * | 4/2002  | LaGrotta et al. .............. 165/185 |
| D507,528  | S  | * | 7/2005  | Feldman et al. ............. D13/110 |
| 6,995,978 | B2 | * | 2/2006  | Strauss ......................... 361/688 |

(Continued)

FOREIGN PATENT DOCUMENTS

| DE | 93 20 825 U1 | 4/1995 |
| DE | 10 2007 005 436 A1 | 8/2008 |
| EP | 1 996 004 A | 11/2008 |
| WO | WO 9931791 A1 * | 6/1999 |

*Primary Examiner* — Courtney Smith
(74) *Attorney, Agent, or Firm* — Thomas|Horstemeyer, LLP

(57) ABSTRACT

An inverter (1) for supplying electric energy from a DC source to an AC grid includes a housing (2) in which electrical and electronic components (21, 22, 30) are accommodated. A cooling air channel (9) with cooling fins (37) arranged along its longitudinal axis runs across the back of the housing (2) in the middle. Sockets (13) for large electrical components (21, 22) that are closed in on at least three sides by the metal outer walls (14-19) of the housing (2) are provide on both sides of the cooling air channel (9) in the housing (2).

40 Claims, 9 Drawing Sheets

(56) References Cited

U.S. PATENT DOCUMENTS

| | | | |
|---|---|---|---|
| 7,031,156 B2 * | 4/2006 | Naiva et al. | 361/695 |
| 7,113,405 B2 * | 9/2006 | Armstrong et al. | 361/719 |
| 7,161,804 B2 * | 1/2007 | Oyamada | 361/703 |
| D562,765 S * | 2/2008 | Tsuzuki et al. | D13/110 |
| 7,535,716 B2 * | 5/2009 | Fischer et al. | 361/714 |
| 7,633,757 B2 * | 12/2009 | Gustine et al. | 361/714 |
| 7,715,195 B2 * | 5/2010 | Bremicker et al. | 361/714 |
| 7,742,298 B2 * | 6/2010 | Kunz | 361/690 |
| 8,031,470 B2 * | 10/2011 | Nelson et al. | 361/704 |
| 8,159,823 B2 * | 4/2012 | Murakami | 361/716 |
| 2002/0141159 A1 * | 10/2002 | Bloemen | 361/704 |
| 2002/0196646 A1 * | 12/2002 | Cook et al. | 363/141 |
| 2008/0180909 A1 | 7/2008 | Illerhaus et al. | |
| 2008/0291632 A1 | 11/2008 | Bremicker et al. | |
| 2010/0302728 A1 * | 12/2010 | Knaup et al. | 361/690 |
| 2010/0309630 A1 * | 12/2010 | Jones et al. | 361/694 |
| 2011/0069451 A1 * | 3/2011 | Hobein et al. | 361/695 |
| 2011/0122669 A1 * | 5/2011 | Santos | 363/141 |
| 2012/0020021 A1 * | 1/2012 | Kishimoto et al. | 361/695 |
| 2012/0026770 A1 * | 2/2012 | West | 363/131 |
| 2012/0182689 A1 * | 7/2012 | Donth et al. | 361/695 |

* cited by examiner

US 8,520,381 B2

INVERTER WITH ELECTRICAL AND ELECTRONIC COMPONENTS ARRANGED IN A SEALED HOUSING

CROSS REFERENCE TO RELATED APPLICATIONS

The present application claims priority to Provisional Patent Application Ser. No. 61/245,058 filed Sep. 23, 2009 and co-pending European Patent Application No. EP 09 170 740.6 entitled "Wechselrichter mit einem Gehäuse und darin angeordneten elektrischen und elektronischen Bauteilen", filed Sep. 18, 2009.

BACKGROUND OF THE INVENTION

The invention relates to an inverter for supplying electric energy from a DC power source to an AC grid, which comprises a sealed housing for accommodating its electrical and electronic components.

More specifically, the inverter may be used to supply electric energy to a public power grid or a stand-alone or island grid from a wind turbine or a photovoltaic generator. Note that the inverter may be especially designed for use in domestic environments such as private homes or residential buildings. This does not preclude using the inverter in other fields as well.

Further, the invention relates to a method of assembling an inverter for supplying electric energy from a DC power source to an AC grid within a sealed housing.

RELATED ART

When an inverter is in operation, its electrical and electronic components generate lost heat which must be dissipated to prevent overheating and possible destruction of components, especially of semiconductor electronics, and hence of the inverter itself. An inverter may have the ability to cease operation, if there is a risk of overheating. Whenever this occurs, however, the power from the DC source is no longer fed to the AC grid, and, as a result, it is lost.

It is generally known that a fan can be used to cool the electrical and electronic components inside the housing of a device by drawing in ambient air and introducing it into the housing as cooling air. One disadvantage of using a fan is that drawn-in air contains dirt and dust which may accumulate within the housing and cause malfunctions of the device. Another disadvantage is that the housing must be relatively large in size to ensure that there is sufficient space, or free flow cross-section, for the cooling air to reach all electrical and electronic components to be air-cooled.

With inverters for supplying electric energy to an AC grid from a local DC source, it is therefore known that their electrical and electronic components are cooled exclusively via the outer surfaces of their housing and cooling fins extending therefrom. These cooling fins are often concentrated on the back side of the housing and ambient air can be blown at them with a fan to improve their cooling performance. In some known inverters of this type, components that generate a great amount of lost heat are arranged on the housing rather than inside the housing so that the ambient air is blown directly at them. Note that the housing does not provide protection for these components.

At the 2008 Intersolar fair in Munich from June 12-14, the Assignee of the present invention presented a design study for an inverter housing. The design study dealt with the external rather than internal side of the housing and was demonstrated as a model made of rigid foam. In the design study, the back of the housing showed a vertical cooling air channel running up the middle, and the upper section of which contained cooling fins that were arranged along the longitudinal axis of the channel. As the model showed, the housing was so narrow that it easily fitted between the wall studs of a typical North American home. The depth of the housing was likewise compact and only slightly longer than the depth of a typical wall stud measuring 10 cm (4 inches). The design study made no mention regarding the internal design of the inverter. Specifically, the question remains as to how such a compact housing design is able to not only accommodate all the electrical and electronic components of the inverter, but also ensure sufficient cooling of the electrical and electronic components during operation of the inverter.

German Utility Model publication DE 93 20 825 U1 discloses an inverter having a pressure die cast housing including a cooling element with cooling fins outwardly extending from its back. Lost heat producing components of the inverter are mounted to the front of the cooling element within the housing. Then, a main board comprising capacitors and chokes is placed in the housing with the top side of the main board comprising these components facing towards the cooling element. The capacitors already mounted to the top side of the main board are protruding into a cooling channel provided within the housing, through which cooling air is passed. The components already mounted to the cooling element have to be connected to the main board which is typically accomplished by soldering connector feet extending from the components and through the main board to the backside of the main board.

European Patent Application publication EP 1 996 004 A (corresponding to US Patent Application publication US 2008/291632 A1) discloses an inverter casing, said inverter casing comprising in the bottom at least one depression for receiving heat dissipating electric components, coils in particular. These depressions are closed by partition plates forming a level surface in the casing. These partition plates forming a level surface in the casing are screwed to the bottom of the casing and have an opening in their center for feeding cables to the electric power components that are located at the bottom of the casing. Cooling fins are located directly on the outer side of the depressions, and additional cooling fins are disposed between the depressions.

German Patent Application publication DE 10 2007 005 436 A1 (corresponding to US Patent Application publication US 2008/180909 A1) discloses a mount module for an inverter including a housing element with a recess being open to the front face, for holding a single inverter. The housing element has a connection device for connecting the inverter. A relatively large number of such mount modules can be disposed one above the other, alongside one another, and/or with their rear faces against each other and can be connected to one another in order, for example, to form a central inverter unit for large photovoltaic installations.

There still is a need for an inverter that is capable of accommodating its electrical and electronic components necessary to supply power in the multi-kilowatt range in a very compact housing while also dissipating the inevitable lost heat coming from said components during operation of the inverter.

SUMMARY OF THE INVENTION

According to an aspect the present invention provides an inverter for supplying electric energy from a DC power source to an AC grid, the inverter comprising: electrical and electronic components, including large electrical components, power electronic components, and a main board; and a sealed housing which accommodates the electrical and electronic components, the housing including a housing back part made of metal that provides: an external cooling air channel extending across a rear side of the housing, cooling fins within the cooling air channel, the cooling fins extending from a base of the cooling air channel and along the cooling air channel, and internal sockets on both sides of the cooling air channel, which accommodate large electrical components, wherein some of the large electrical components in the internal sockets are screwed to the housing back part and connected via plug contacts to the main board that is positioned in the housing back part with its top side facing backwards, wherein the others of the large electrical components in the internal sockets are soldered to the top side of the main board, and wherein the power electronic components are soldered to the top side of the main board and are screwed, through the main board to an inner side of the base of the cooling air channel.

According to another aspect the present invention provides a method of assembling an inverter for supplying electric energy from a DC power source to an AC grid, the method comprising the steps of providing electrical and electronic components, including large electrical components, power electronic components, a main board, and a housing for accommodating the electrical and electronic components, the housing including a housing back part made of metal which provides an external cooling air channel extending across a rear side of the housing, cooling fins within the cooling air channel, the cooling fins extending from a base of the cooling air channel and along the cooling air channel, and internal sockets on both sides of the cooling air channel for accommodating large electrical components; arranging some of the large electrical components each in one of the internal sockets, and screwing them to the housing back part; soldering the power electronic components and the others of the large electrical components to a top side of the main board; upon positioning the main board within the housing back part with its top side facing backwards, locating each of the others of the large electrical components soldered to the top side of the main board in one of the internal sockets, and electrically connecting each of the some of the large electrical components already screwed to the housing back part to the main board via plug contacts; screwing the power electronic components soldered to the top side of the main board through the main board arranged in the housing back part to an inner side of the base of the cooling air channel; and sealing the housing.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
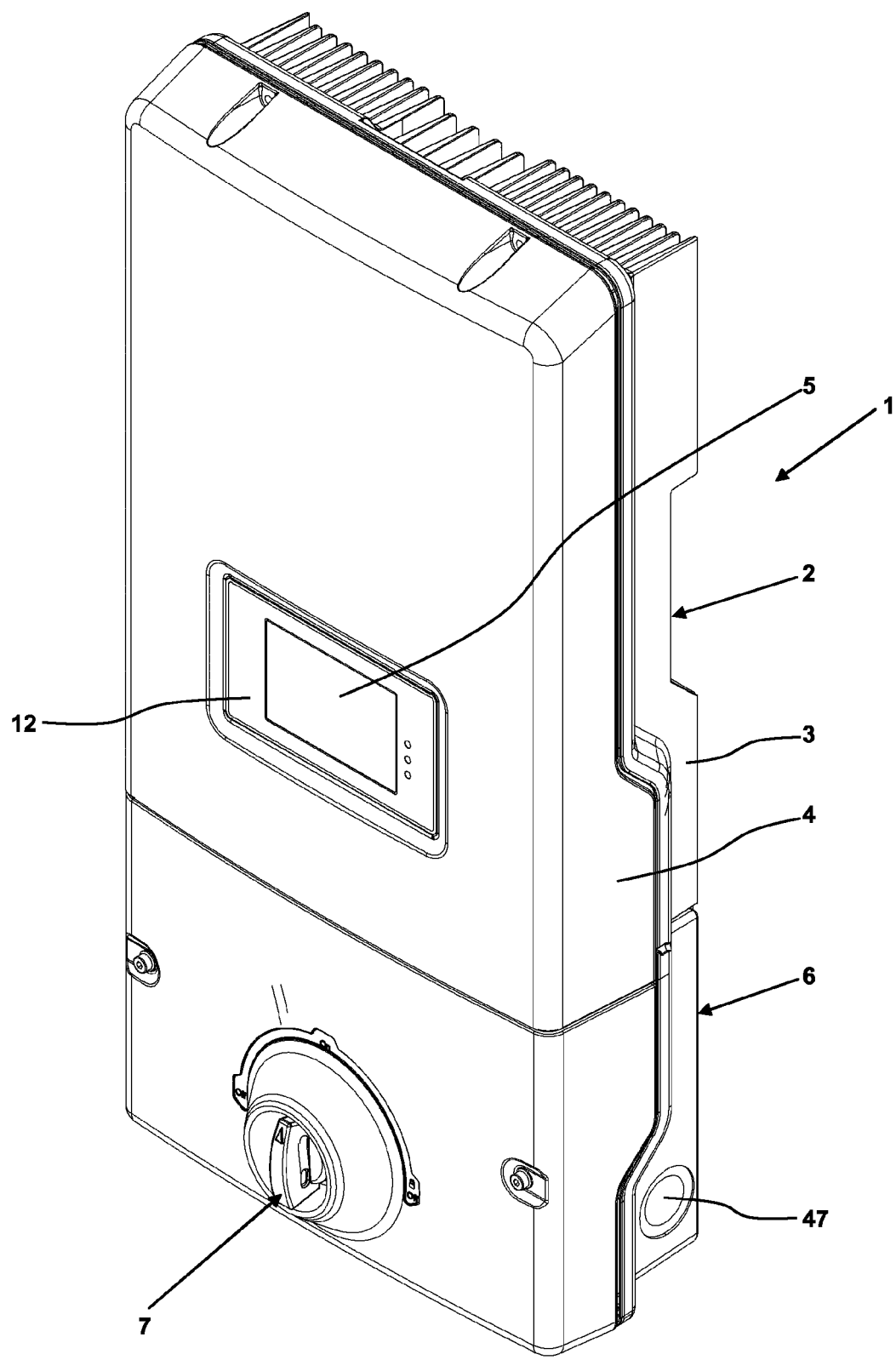
FIG. 1 is a perspective front view of the inverter with its housing being closed.

In the housing of the new inverter, sockets are formed on both sides of a cooling air channel on the back side, which each accommodate one large electrical component in such a way that the large electrical component is closed in on three sides by metal outer walls of the housing. Lost heat produced by the large electrical component can therefore be dissipated in at least three directions via the outer walls of the housing and then into the ambient air. Generally speaking, the three directions refer to the back side and both lateral sides of the housing, i.e., towards and away from the cooling air channel. To this end, the sockets are located next to the cooling air channel and directly adjacent to the external lateral dimensions of the housing. A further metal wall for the socket may be added by an outer wall of the housing in a direction parallel to the cooling air channel, where the socket would then also be adjacent to the external vertical dimensions of the housing. Regarding sockets for coil forms without a core, a central bearing dome made of non-magnetic metal may extend from the base of the socket and touch the internal surface of the coil forms. Even if compared with attaching a component to the outside of the housing, the new inverter offers better cooling of each large electrical component with the ambient air, because the surface area through which the lost heat is dissipated into the environment is strongly enlarged by the housing. In addition, the housing of the new inverter has minimum dimensions in lateral direction in that it is just wide enough for accommodating the large electrical components in enclosing sockets on both sides of the cooling air channel. In terms of the depth of the new inverter, the arrangement of large electrical components on both sides of the cooling air channel is likewise an advantage in that all available space is used at a maximum extent.

The large electrical components of the new inverter usually involve coil forms, i.e. chokes, on the one hand, and capacitors, frequently electrolytic capacitors, on the other hand. Capacitors must be kept at a defined distance from the inverter housing and must never come into direct contact with it. But even with capacitors, it has proven to be advantageous to have them surrounded by the metal outer walls of the housing in at least three directions to better dissipate the lost heat generated in them. With regard to coil forms, the sockets may also be formed to snugly fit the standard electrical insulation of the coil forms so that their lost heat is absorbed directly by the metal walls.

The power electronic components of the new inverter that produce a large amount of lost heat are preferably attached to a metal wall of the housing whose back side forms the base of the cooling air channel. In this area, the cooling performance due to the ambient air on the back of the other outer wall has a maximum. Furthermore, a relatively high heat input at the base of the cooling air channel maximizes the chimney effect which arises from the ambient air heated in the cooling air channel, and which causes the ambient air to ascent in the cooling air channel, i.e. flow through the cooling air channel without the need for a fan.

To spread the lost heat generated by the power electronic components as widely as possible, the outer wall of the housing of the new inverter behind said components should be thicker than the other wall areas of the housing and/or should have cooling fins on the back of the housing.

The coil forms and the power electronic components should be screwed to the housing of the new inverter to the point to press them against the respective outer walls of the housing to optimize the transfer of lost heat generated from these components to the housing. The heat transfer process may be boosted by heat-conductive paste that is applied between the components and the housing walls. Whereas the coil forms should be individually screwed to the housing, the large number of terminal contacts in the power electronic components means that they should be first soldered to the main board of the inverter and then screwed to the housing through the main board to which they are already electrically connected. This also secures the main board in place within the housing.

The main board of the new inverter that is contacted to the large electrical components and the power electronic components should be aligned in the housing with its top, at which the components are located, facing backwards. Preferably, plug contacts are provided between the main board and all the components that have individually been attached to the housing. This means that these components are not soldered to the main board in the housing but connected to the main board via plug contacts.

Along the plane of main extension of the new inverter, the main board contacted to the large electrical components and power electronic components can span the entire interior cross-section of the housing that remains opens. Even then, the main board may spare the cross-section occupied by any large coil forms that extend along the entire depth of the housing. The new inverter normally includes only one of these large coil forms.

Inspection points provided at the base of the main board, which is pointing towards the front in the housing, as well as screw connection points for the main board and for the power electronic components are easily accessible in the new inverter. No components that protrude from the base of the main board get in the way of any sensors or fastening tools used.

There is also sufficient space for a control board, which can be placed inside the housing of the new inverter together with the main board. This control board should be arranged inside the housing with its upper side facing forward, and then electrically linked to the main board via one or more multi-point connection plug boards. This may be the only way of attaching the control board in the housing if, for example, its connection to the main board via the multipoint connection plug boards is secured by a lid of the housing. The lid may comprise a small window for viewing a display on the control board.

Preferably, only the top sides of the main board and the control board are equipped with wired components. Vice versa, the position of these wired components determines the top side of the respective circuit board. Nevertheless, surface mounted devices (SMDs) or press-fitted components such as contact plugs may also be provided at the base of the circuit boards.

In the new inverter, the back section of the housing, which comprises the cooling channel, cooling fins and the sockets for the large electrical components, is casted as a single piece from metal. In this way the complex housing design in this area, may be economically produced in large scale series. It is particularly preferable to have at least this section of the housing die-casted of a non-magnetic aluminum alloy. The front lid of the housing may also be made using this type of die casting aluminum alloy.

As previously indicated, the cooling channel in the new inverter should run vertically in a straight line so that a chimney effect due to the hot air in the channel can be exploited. The air flow in the cooling channel may also be enhanced by a fan that draws ambient air into the channel.

For the purpose of inverter mounting, the housing may be suspended in a mounting tray where terminal lines for connecting the inverter to the DC source and the AC grid are provided. This type of mounting tray makes it easy to laterally mount the inverter to vertical stands, and a rear wall of the mounting tray can form air supply pockets above and below the housing. If the upper air supply pocket tapers upwards and/or the lower air supply pocket tapers downwards, turbulences in ambient air, which is routed as cooling air through the cooling air channel between the inverter housing and the rear wall of the mounting tray, can be avoided at the vertical ends of the mounting tray. To hide the mounting tray, a covering can be provided that comprises a large opening for the inverter and air supply openings in the area of the lower and upper air supply pocket. The mounting tray will preferably be made of metal such as sheet metal. This material may also be used to make the covering for the inverter.

Figure 2:
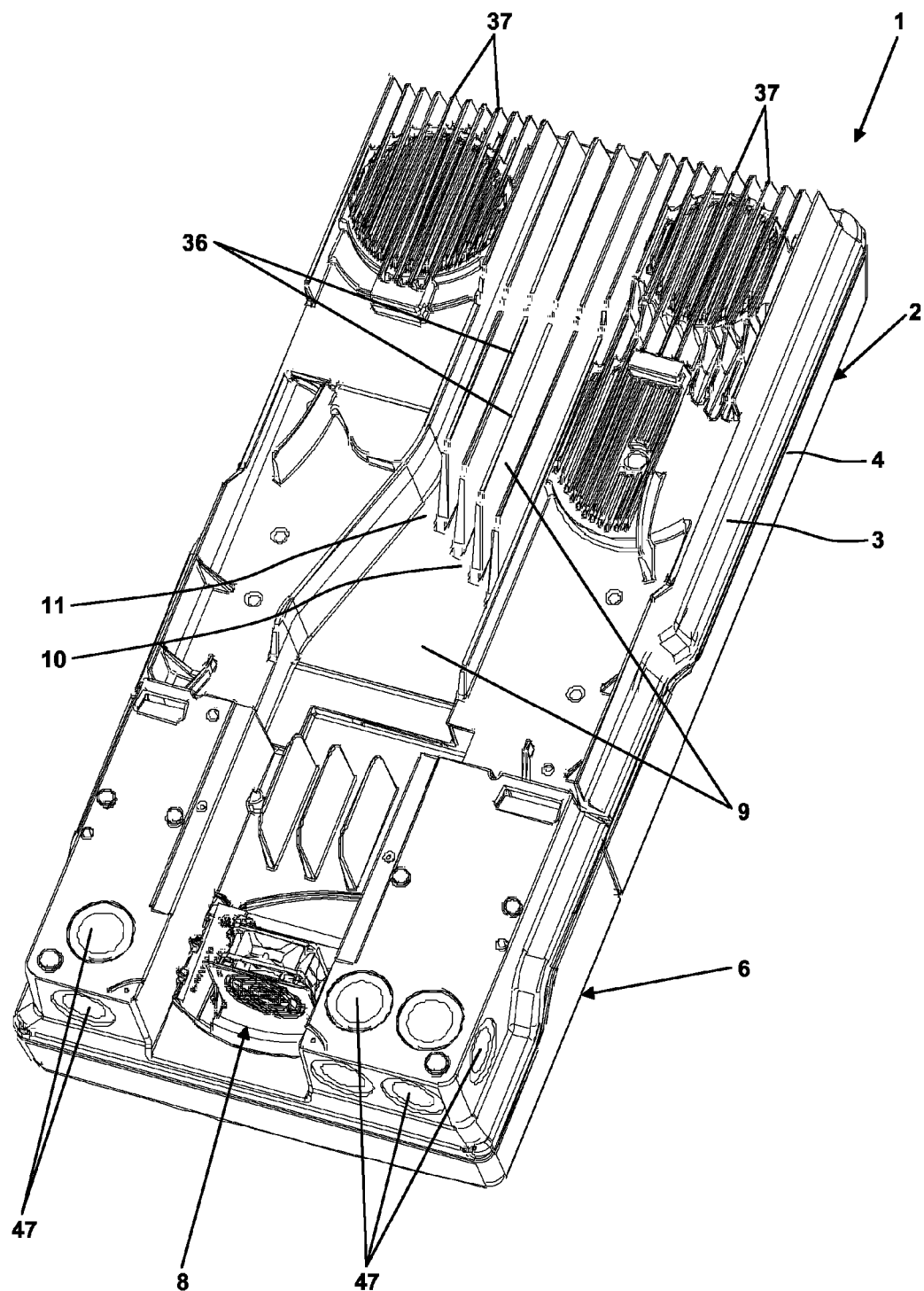
FIG. 2 is perspective back view of the inverter of FIG. 1 with its housing still being closed.

Now referring in greater detail to the drawings, the inverter 1 completely shown in FIGS. 1 and 2 and designed to supply electric energy from a DC source to a AC power grid comprises a housing 2. The housing 2 comprises a housing back part 3, which accommodates the basic electrical and electronic components of the inverter, and a lid 4, which closes the housing rear section 3 at the front and which includes a view window 5. The lid 4, except for the view window 5, and the housing back part 3 are each die-casted of an aluminum alloy and enclose the electrical and electronic components of the inverter 1 in a non-magnetic metal casing. A unit 6 that includes a DC load disconnector 7 and an optional fan 8 as externally visible components of the inverter 1 is attached to the housing 2. The DC load disconnector 7 provides a safe way of disconnecting the inverter 1 from a connected DC source. The fan 8 is used to blow ambient air as cooling air from below and into the vertical cooling air channel 9 on the back of the housing 2. At higher powers of the inverter 1 and thus higher absolute lost heat, the fan 8 provides an effective way of dissipating the lost heat and removing it from the housing 2. Given a smaller power of the inverter, the chimney effect developed in the cooling air channel 9 is sufficient for cooling the housing 2 because the highest temperatures at the outer walls of the housing 2 are reached at the outer wall 10 at the base 11 of the cooling air channel 9. More detail on that will be given with reference to FIG. 4. The inverter 1 is connected to the DC source and the AC power grid via the unit 6. The unit 6 includes pre-made holes 47 for routing the electrical connection cables. The housing 2 and structural unit 6 are as a whole so narrow that the inverter 1 fits between the wall studs of a typical North American home. The depth of the housing 2 and the unit 6 are also similar to the depth that these walls usually have. Of the components inside the housing 2, FIG. 1 only shows a display 12 behind the view window 5.

Figure 3:
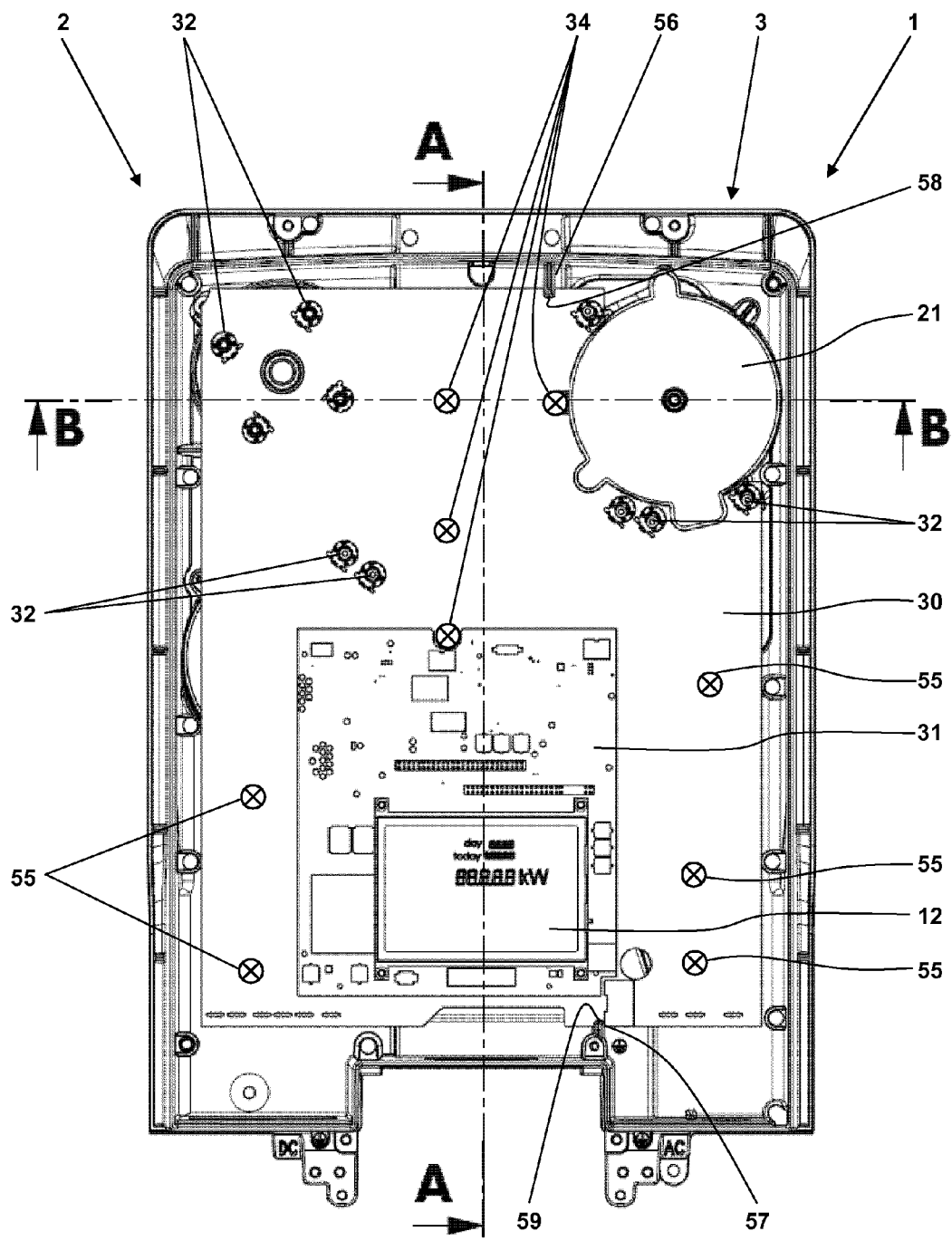
FIG. 3 is a view inside the opened housing of the inverter of FIGS. 1 and 2.
Figure 4:
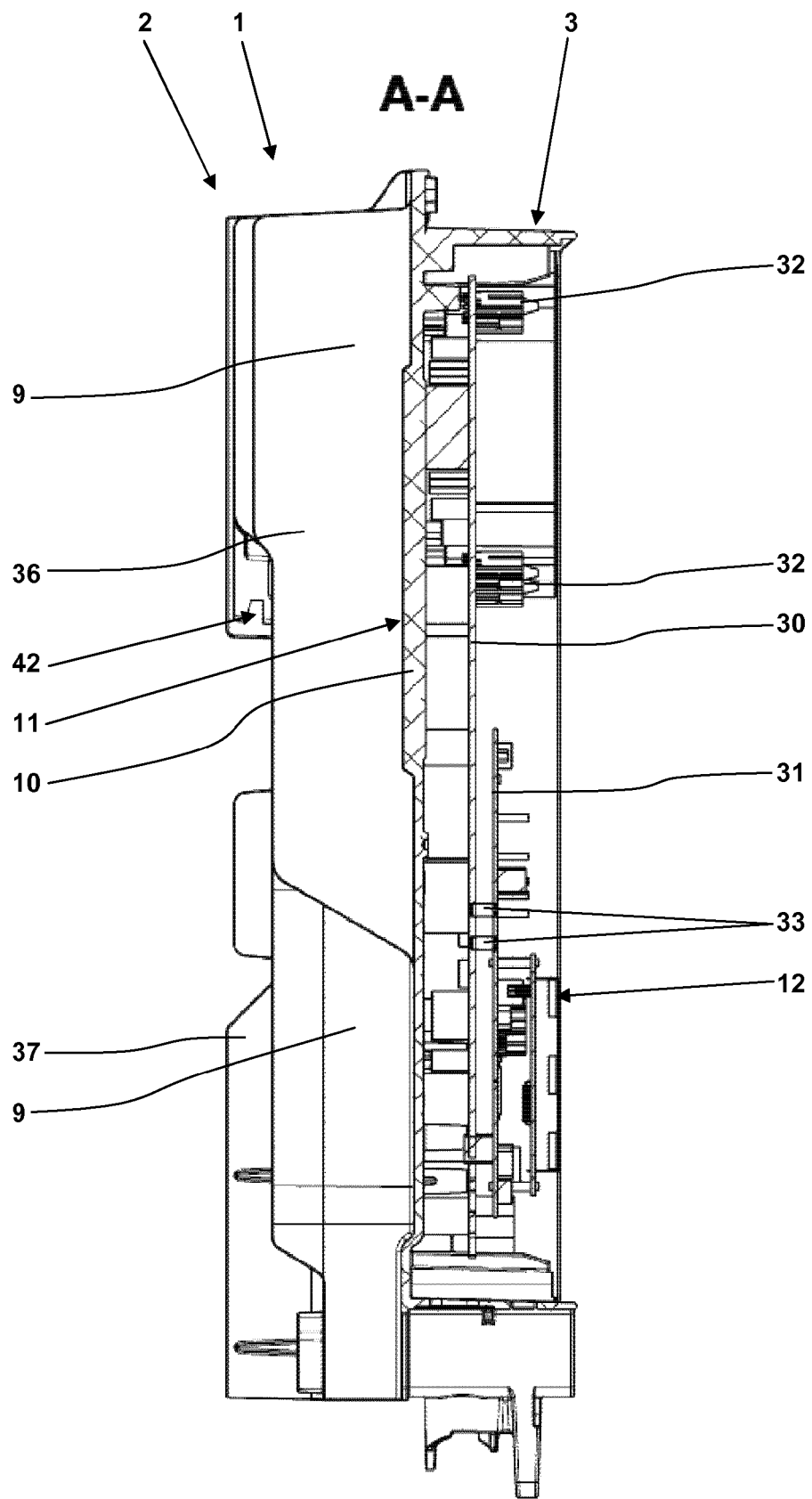
FIG. 4 is a vertical section through the inverter of FIGS. 1 to 3 with its housing being opened, along a line A-A indicated in FIG. 3.
Figure 5:
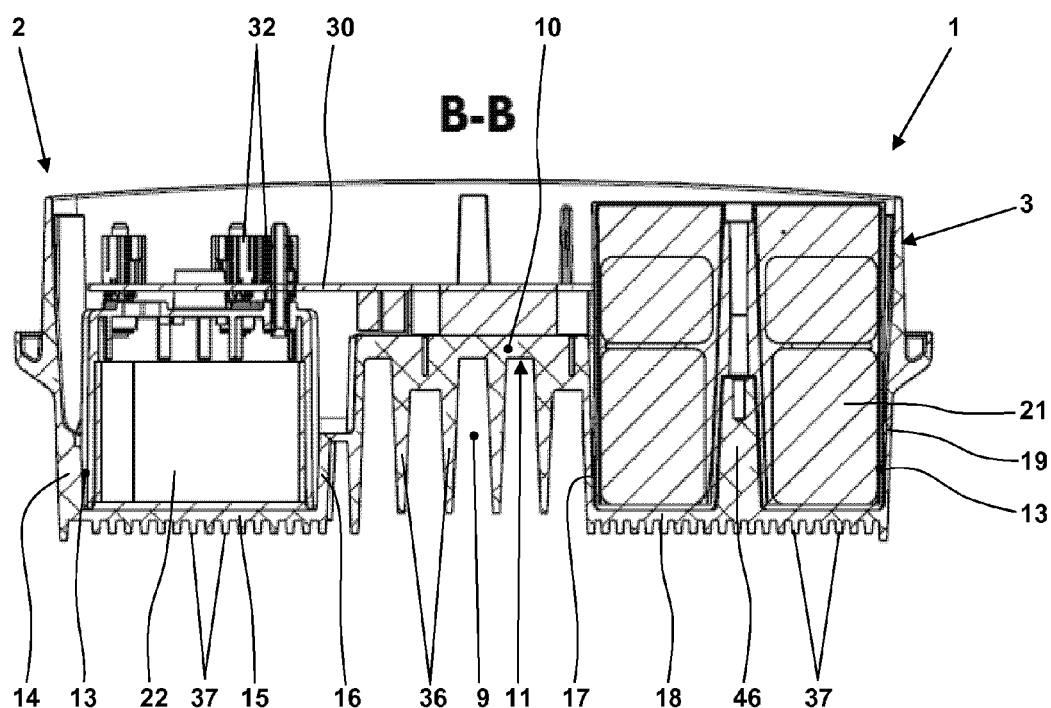
FIG. 5 is a horizontal section through the inverter of FIGS. 1 to 3 with its housing being opened, along a line B-B indicated in FIG. 3.
Figure 6:
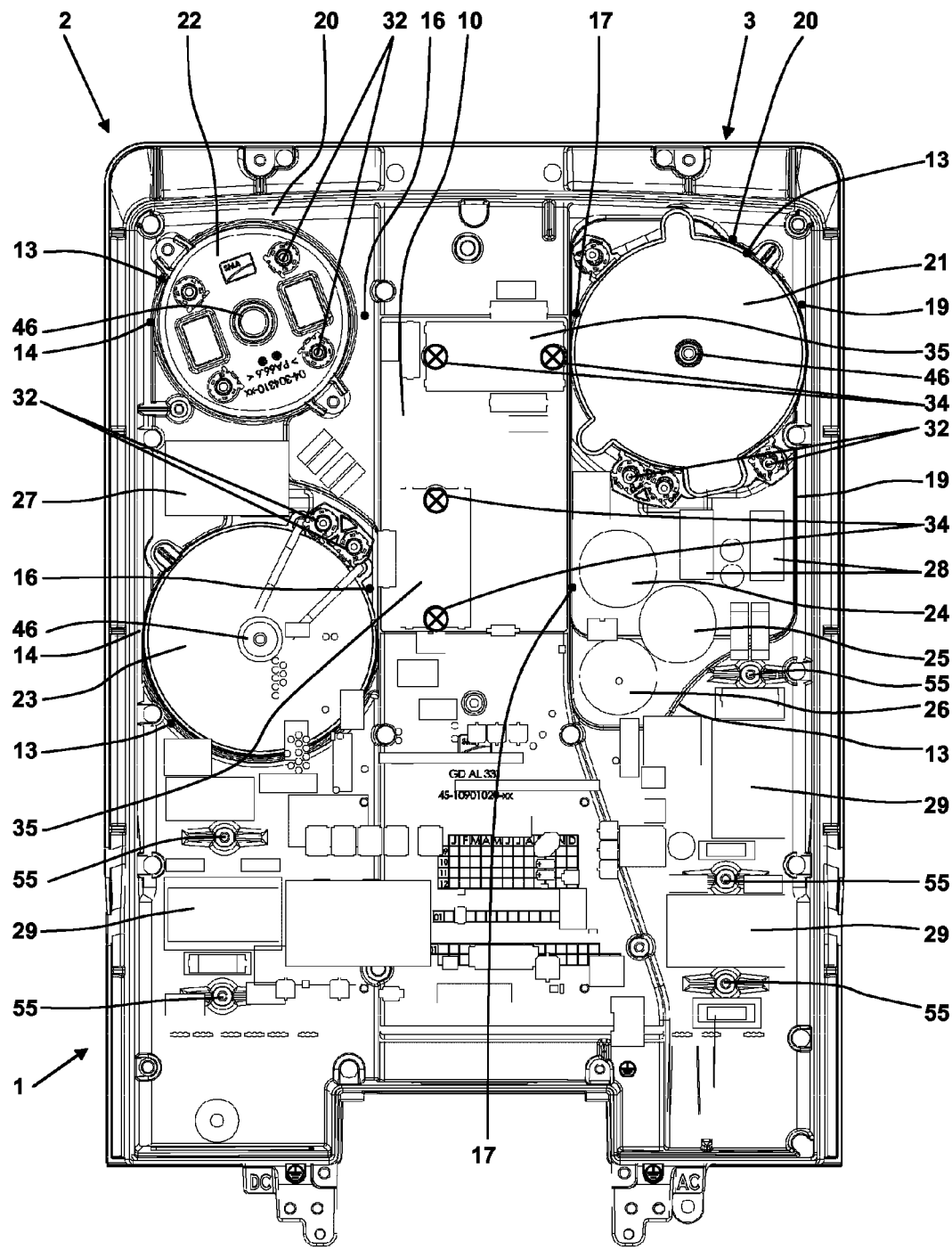
FIG. 6 is a vertical section through the inverter along a sectional plane located behind the drawing plane of FIG. 3, with a view on the large electrical and electronic components of the inverter.

The other components of the inverter 1 can only be seen from the top view provided in FIG. 3 and the sections shown in FIGS. 4, 5, and 6. These illustrations all show that the housing rear part 3, within the housing 2, includes sockets 13 for the large electrical components of the inverter 1 on both sides of the cooling air channel 9. The sockets 13 are closed in on at least three sides by the outer walls 14 to 20 of the housing 2 so that the lost heat from the large electrical components arranged in the sockets 13 is dissipated via these outer walls 14 to 20 directly into the surrounding environment of the inverter 1. Large electrical components in the form of coil forms 21 to 23 are in direct contact with the outer walls 14 to 20 of the housing 2, and are attached by screws to the housing back section 3. The coil forms 21 to 23 with toroidal cores are arranged on bearing domes 46, which protrude from, and are part of, the housing back part 3. Large electrical components of the inverter 1 in the form of electrolytic capacitors 24 to 26 and a film capacitor 27 extend into the relevant sockets 13 as far as is possible without touching the adjacent outer walls 14 to 20. The capacitors 24 to 27 are mounted to a main board 30 of the inverter 1 (not depicted in FIG. 6). The top side of the main board, which holds wired components, is facing towards the back of the housing 2 so that only SMDs and pressed-fitted components mounted at the base of the board can be seen in FIG. 3. The coil forms 21 to 23 attached to the housing back section 3 are contacted with the main board 30 upon assembly of the inverter 1 via plug contacts 32, which are closed when the main board 30 is inserted into the housing 2. When placing the main board 30 in the housing back part 3 the main board 30 is aligned with regard to the contour of the housing back part 3 and with regard to the coil forms 21 to 23 already mounted to the housing by at least one guiding rib 56, 57 extending from the circumference of the housing back part 3 into the interior of the housing 2, which engages a corresponding notch 58 or 59, respectively, provided in the circumference of the main board 30. The plug contacts 32 fix the position of the main board 30 in the upper area of the housing back part 3. In the lower part of the housing back section 3, the main board 30 is fastened in place by screws 55.

FIG. 6 shows relays 28 and EMC chokes 29, which are also large electrical components of the inverter 1. As can be seen from FIG. 3, despite the fact that the main board 30 spans the free vertical cross-section of the housing 2 along its entire plane of main extension except for the area around the large coil form 21, there is enough space in the front area of the housing rear section 3 for a control board 31, which is connected electrically and mechanically to the main board 30 via multipoint connection plug boards 33 and which can be held in its place by the lid 4 shown in FIGS. 1 and 2. The display 12 already visible in FIG. 1 is provided on the control board 31. The top side of the control board 31 is facing to the front. The boards 30, 31 are placed in parallel to each other in such a way that their back sides are opposite with the interposition of the multipoint connection plug boards 33.

Inspection points at the back side of the main board 30, which are provided for testing purposes, are as easy to access as screws 55 used to attach the main board 30 to the housing back section 3. Further easily accessible screws 34 are located adjacent to the power electronic components 35, such as the switching modules for the inverter bridges of the inverter 1, in order to screw these components 35, which are soldered onto the main board 30, to the wall 10 for the purpose of thermally linking them to this outer wall 10 of the housing 2, which on its opposite side forms the base 11 of the cooling channel 9. Additionally, a layer of heat-conductive paste can be provided between the power electronic components 35 and the outer wall 10, which has a greater thickness than other walls of the housing 2 for better heat spreading. The cooling channel 9, which extends vertically and linearly along the middle of the rear side of the housing 2, features cooling fins 36, particularly in its upper area and extending from the wall 10 behind the power electronic components 35. Additional cooling fins 37, some of which are shorter, increase the overall heat-radiating surface area on the back of the housing 2.

In the new inverter 1 full use is made of the entire volume of the housing 2 including the cooling air channel 9. The volume within the housing 2 that remains free is basically required to keep the necessary distances of the electrical components to each other and to the housing 2. The remaining free space in the front area of the housing 2 can be used to accommodate a larger control board 31, which may be necessary under some conditions.

Figure 7:
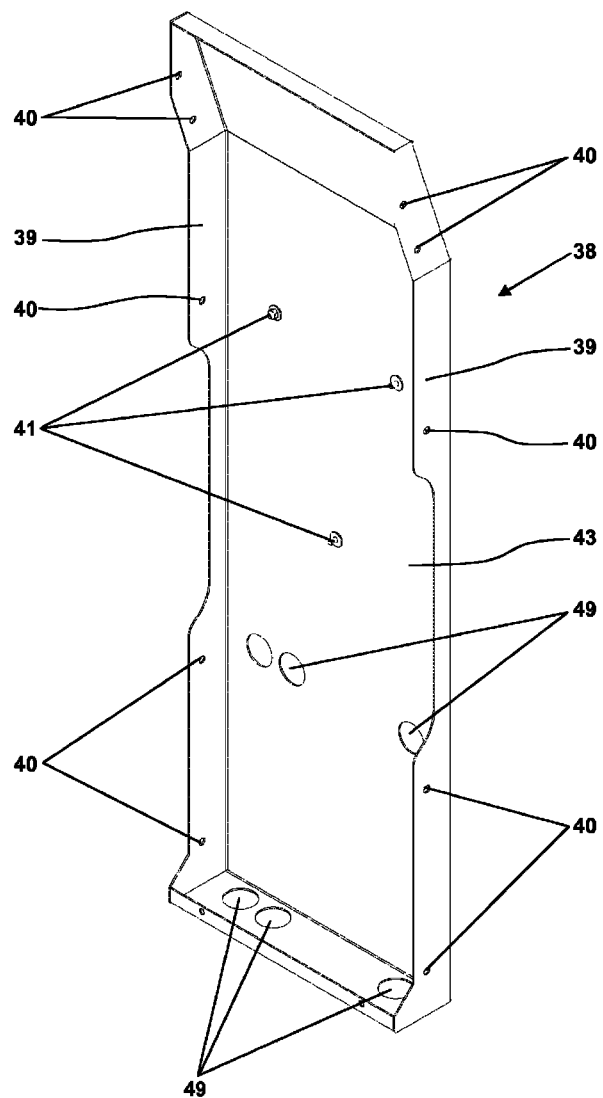
FIG. 7 depicts a mounting tray for mounting the inverter as shown in FIGS. 1 to 3.

The mounting tray 38 depicted in FIG. 7 features two side walls 39 with mounting holes 40 for attaching the mounting tray laterally to two adjacent wall studs of a typical North American home. The mounting tray is inserted between the wall studs and holds the inverter 1. The tray supports the inverter via a suspension device (not depicted) which is attached using the threaded bolts 41 on the tray 38 and a hook 42 (see FIG. 4) located on the back of the inverter 1. Thus, the inverter 1 is suspended from the rear wall 43 of the mounting tray, the cooling fins 36 and 37 of the inverter being in contact with the rear wall 43, and the cooling air channel 9 being essentially enclosed around his direction of main extension. Terminal lines and their corresponding through holes 49 can be provided at the mounting tray and used to connect the inverter while it is suspended.

Figure 8:
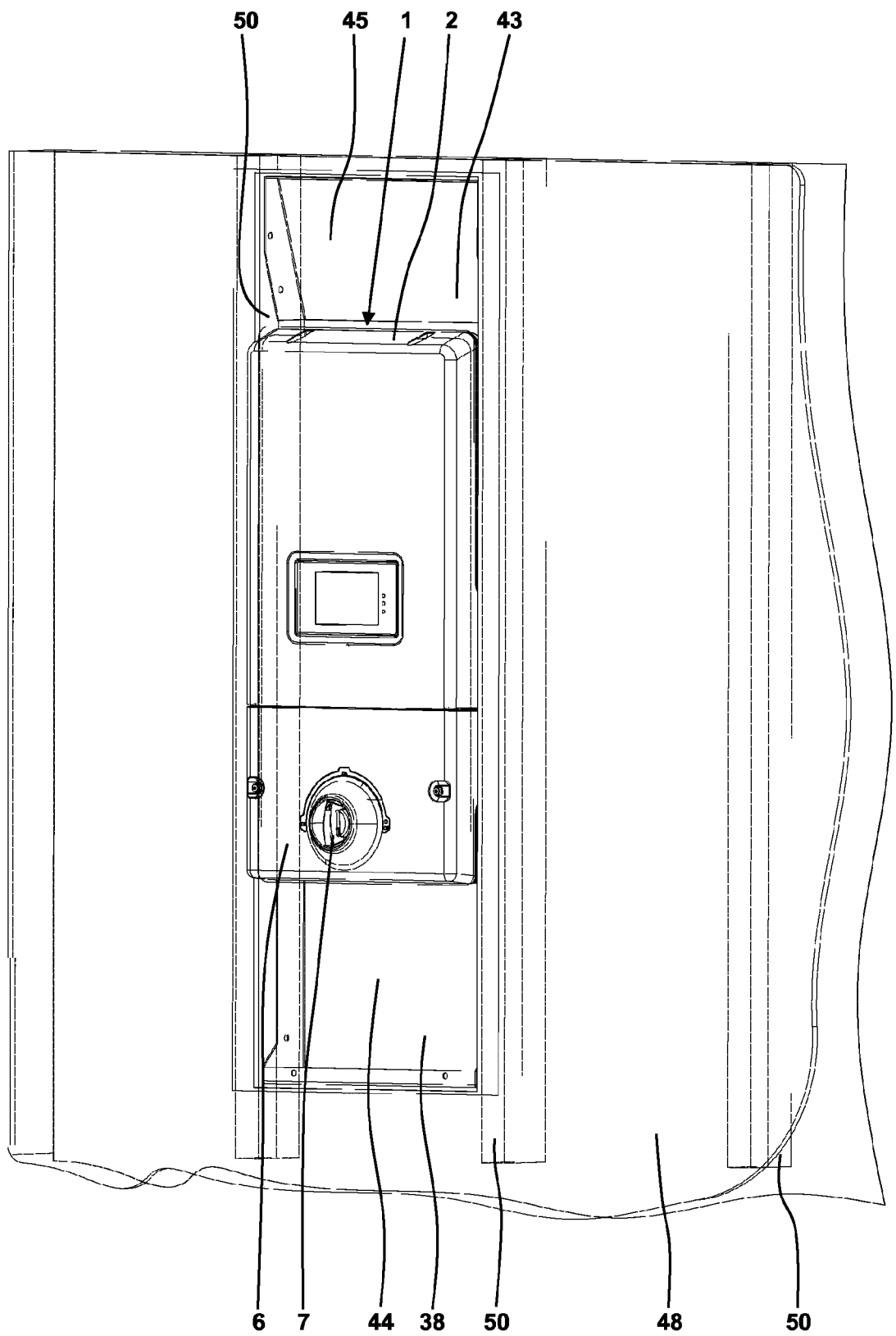
FIG. 8 depicts the inverter shown in FIGS. 1 to 3 mounted between wall studs of a wall with the aid of the mounting tray shown in FIG. 7.

FIG. 8 shows the mounting tray 38 with mounted inverter 1 attached between two studs 50 in a wall 48 made of planked studs 50. It also shows that air supply pockets 44 and 45 remain above and below the inverter 1 within the mounting tray 38, the upper air supply pocket 45 tapering in upward direction and routing the hot ambient air that ascents in the cooling air channel 9 to the front of the adjacent wall 48, while cool ambient air flows in the cooling air channel 9 via the lower air supply pocket tapering in downward direction.

Figure 9:
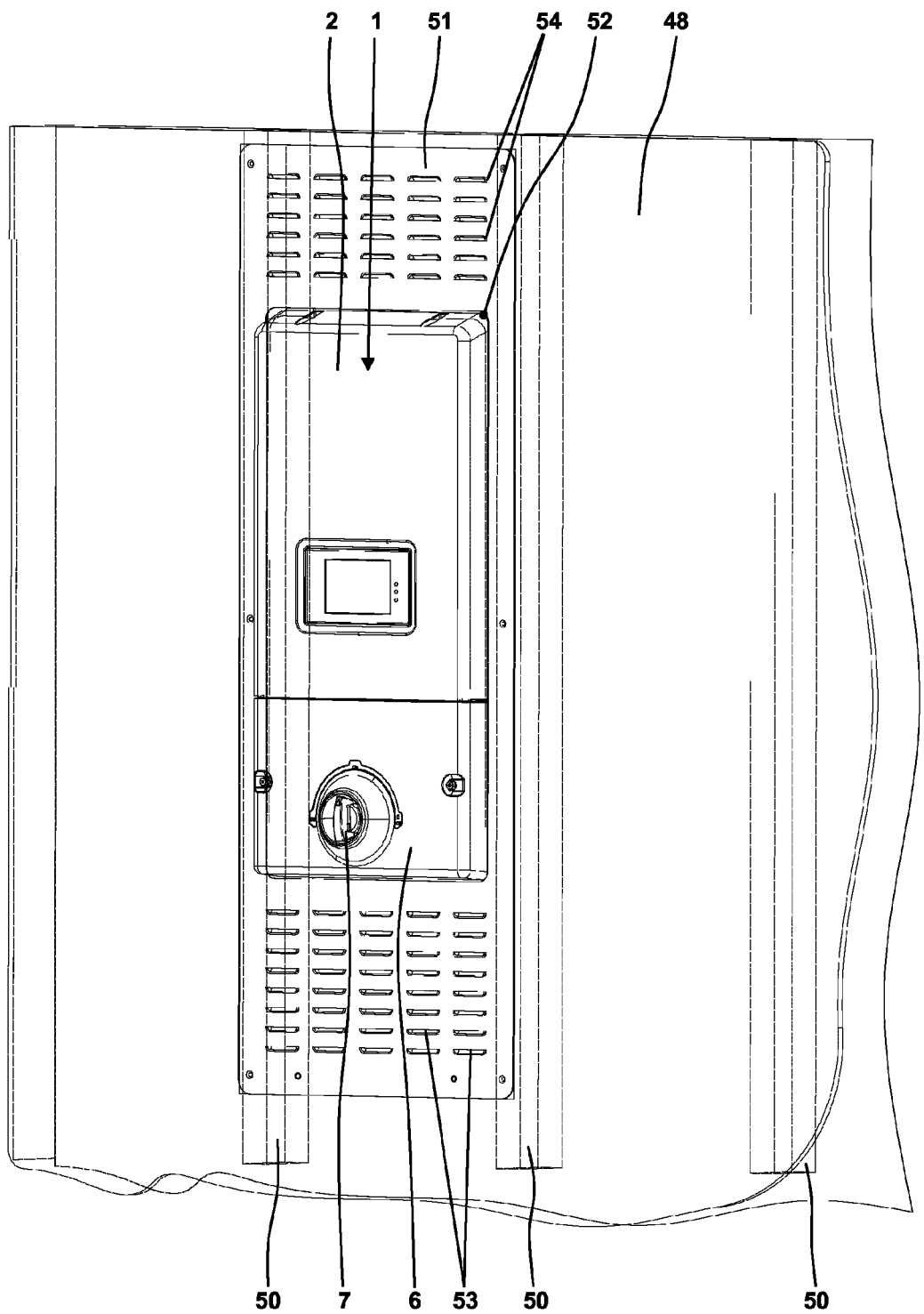
FIG. 9 depicts the inverter mounted in the wall as shown in FIG. 7 after the mounting tray has been covered with a covering sparing the inverter.

In FIG. 9, the mounting tray 38 is encased by a covering 51 which only spares the inverter 1 via an opening 52 and which has air supply holes 53 and 54 in front of the air supply pockets 44 and 45, respectively. The front of the covering 51 essentially extends within a same geometrical plane as the wall 48.

Many variations and modifications may be made to the preferred embodiments of the invention without departing substantially from the spirit and principles of the invention. All such modifications and variations are intended to be included herein within the scope of the present invention, as defined by the following claims.

We claim:
1. An inverter for supplying electric energy from a DC power source to an AC grid, the inverter comprising:
 electrical and electronic components, wherein the electrical and electronic components include large electrical components, power electronic components, and a main board; and
 a sealed housing which accommodates the electrical and electronic components, the sealed housing including a housing back part made of a metal, wherein the sealed housing provides:

an external cooling air channel extending across a rear side of the sealed housing, cooling fins within the cooling air channel, the cooling fins extending from a base of the external cooling air channel and along the external cooling air channel, and internal sockets in the housing back part, the internal sockets on both sides of the external cooling air channel, wherein the internal sockets accommodate the large electrical components, wherein some of the large electrical components in the internal sockets are screwed to the housing back part and connected via plug contacts to the main board, the main board is positioned in the housing back part with a top side of the main board, the top side facing toward the housing back part, wherein others of the large electrical components in the internal sockets are soldered to the top side of the main board, and wherein the power electronic components are soldered to the top side of the main board and the power electronic components are screwed, through the main board, to the housing back part at an inner side of the base of the external cooling air channel.

2. The inverter of claim 1, wherein the main board is screwed to the housing back part.

3. The inverter of claim 1, wherein the main board is positioned within a free inner cross-sectional area of the housing back part by means of an internal positioning rib of the housing back part extending inwardly from a circumferential portion of the housing back part.

4. The inverter of claim 1, wherein the internal sockets accommodate the some of the large electrical components in such a way that the some of the large electrical components are closed in on at least three sides by the metal of the housing back part.

5. The inverter of claim 4, wherein the metal of the housing back part forming the internal sockets is formed around the large electrical components.

6. The inverter of claim 5, wherein heat-conductive paste is applied between the some of the large electrical components and the metal of the housing back part.

7. The inverter of claim 1, wherein the base of the external cooling air channel has greater thickness than adjacent portions of the housing back part.

8. The inverter of claim 1, wherein heat-conductive paste is applied between the power electronic components and the inner side of the base of the external cooling air channel.

9. The inverter of claim 1, wherein in a mounted position of the inverter, the main board spans a free vertical inner cross-section of the housing back part.

10. The inverter of claim 1, wherein the electrical and electronic components further include a control board that is mounted with a back side of the control board facing the back side of the main board.

11. The inverter of claim 10, wherein the main board is provided with a first portion of wired components of the electrical and electronic components exclusively on the top side of the main board and the control board is provided with a second portion of the wired components of the electrical and electronic components exclusively on a top side of the control board, the top side of the control board opposing the back side of the control board.

12. The inverter of claim 10, wherein at least one multipoint connection plug board is provided between the main board and the control board.

13. The inverter of claim 1, wherein the housing back part is a one-piece body casted of the metal.

14. The inverter of claim 13, wherein the one-piece body casted of the metal is die-casted of an aluminum alloy.

15. The inverter of claim 1, wherein in a mounted position of the inverter, the external cooling air channel is running vertically.

16. The inverter of claim 15, wherein a fan is designed and arranged for blowing ambient air into the external cooling air channel from below the external cooling air channel.

17. The inverter of claim 1, wherein the sealed housing further includes a housing front part sealingly closing a front opening of the housing back part.

18. The inverter of claim 17, wherein the housing front part consists of a one-piece body casted of the metal and a display window inserted in an opening of the one-piece body.

19. The inverter of claim 18, wherein the one-piece body casted of the metal is die-casted of an aluminum alloy.

20. The inverter of claim 1, wherein the sealed housing is suspended in a mounting tray that is configured for being mounted laterally between vertical beams, and the mounting tray has a rear wall forming air supply pockets above and below the sealed housing.

21. A method of assembling an inverter for supplying electric energy from a DC power source to an AC grid, the method comprising the steps of:

providing electrical and electronic components, wherein the electrical and electronic components include large electrical components, power electronic components, a main board, and a housing for accommodating the electrical and electronic components, the housing including a housing back part made of a metal that provides an external cooling air channel extending across a rear side of the housing, cooling fins within the external cooling air channel, the cooling fins extending from a base of the external cooling air channel and along the external cooling air channel, and internal sockets in the housing back part, the internal sockets being arranged on both sides of the external cooling air channel for accommodating the large electrical components;

arranging some of the large electrical components, each of the some of the large electrical components in one of the internal sockets, and screwing the some of the large electrical components to the housing back part;

soldering the power electronic components and others of the large electrical components to a top side of the main board;

upon positioning the main board within the housing back part with the top side of the main board facing backwards toward the housing back part, locating each of the others of the large electrical components soldered to the top side of the main board in one of the internal sockets, and electrically connecting the each of the some of the large electrical components already screwed to the housing back part to the main board via plug contacts;

screwing the power electronic components soldered to the top side of the main board through the main board arranged in the housing back part to the housing back part at an inner side of the base of the external cooling air channel; and sealing the housing.

22. The method of claim 21, further comprising a step of screwing the positioned main board to the housing back part.

23. The method of claim 21, wherein in the step of positioning the main board within the housing back part, the main board is positioned within a free inner cross-section of the housing back part in contact with an internal positioning rib of the housing back part extending inwardly from a circumferential portion of the housing back part.

24. The method of claim 21, wherein in the step of arranging the some of the large electrical components, the some of the large electrical components are arranged in the internal sockets in such a way that the some of the large electrical components are closed in on at least three sides by the metal of the housing back part.

25. The method of claim 24, wherein in the step of arranging the some of the large electrical components, heat-conductive paste is applied between the some of the large electrical components and the metal of the housing back part formed around the some of the large electrical components.

26. The method of claim 21, wherein in the step of positioning the main board within the housing back part, heat-conductive paste is applied between the power electronic components soldered to the main board and the inner side of the base of the external cooling air channel.

27. The method of claim 21, wherein in the step of soldering the power electronic components and the others of the large electrical components, wired components of the electrical and electronic components are exclusively located on the top side of the main board.

28. The method of claim 21, further comprising a step of mounting a control board with a back side of the control board facing the back side of the main board.

29. The method of claim 28, further comprising a step of soldering wired components of the electrical and electronic components to the control board, wherein the wired components are exclusively located on the top side of the control board.

30. The method of claim 28, wherein in the step of mounting the control board the main board and the control board are electronically connected by at least one multipoint connection plug board.

31. The method of claim 21, further comprising a step of casting the housing back part as a one-piece body of the metal.

32. The method of claim 31, wherein the step of casting the one-piece body of the metal includes die-casting the housing back part of an aluminum alloy.

33. The method of claim 21, further comprising a step of orientating the housing back part such that the external cooling air channel is running vertically.

34. The method of claim 33, further comprising a step of mounting a fan to the housing back part at a lower end of the external cooling air channel for blowing ambient air into the external cooling air channel from below the external cooling air channel.

35. The method of claim 21, wherein the step of sealing the housing includes closing a front opening of the housing back part with a housing front part.

36. The method of claim 35, wherein the step of sealing the housing includes arranging an elastic sealing material between the housing back part and the housing front part.

37. The method of claim 35, further comprising steps of casting the housing front part as a one-piece body of the metal, and of inserting a display window in an opening of the one-piece body to provide the housing front part.

38. The method of claim 37, wherein the step of casting the one-piece body of the metal includes die-casting the one-piece body of the housing front part of an aluminum alloy.

39. The method of claim 33, wherein orientating the housing back part comprises the steps of providing a mounting tray having a rear wall forming air supply pockets above and below a mounting area, mounting the mounting tray laterally between vertical beams, mounting the housing to the mounting area of the mounting tray, and connecting the inverter to the DC source and the AC power grid via terminal lines provided at the mounting tray.

40. The method of claim 34, wherein orientating the housing back part comprises the steps of providing a mounting tray having a rear wall forming air supply pockets above and below a mounting area, mounting the mounting tray laterally between vertical beams, mounting the housing to the mounting area of the mounting tray, and connecting the inverter to the DC source and the AC power grid via terminal lines provided at the mounting tray.

* * * * *